(12) United States Patent
Uemura et al.

(10) Patent No.: US 7,795,075 B2
(45) Date of Patent: Sep. 14, 2010

(54) FLIP CHIP MOUNTING METHOD BY NO-FLOW UNDERFILL HAVING LEVEL CONTROL FUNCTION

(75) Inventors: Naruhiko Uemura, Tokyo (JP); Akihiro Nakamura, Tokyo (JP); Takashi Mori, Tokyo (JP); Hirofumi Matsumoto, Tokyo (JP)

(73) Assignee: Nippon Mektron, Ltd., Tokyo (JP)

( * ) Notice: Subject to any disclaimer, the term of this patent is extended or adjusted under 35 U.S.C. 154(b) by 428 days.

(21) Appl. No.: 11/901,169

(22) Filed: Sep. 14, 2007

(65) Prior Publication Data
US 2008/0153201 A1 Jun. 26, 2008

(30) Foreign Application Priority Data
Dec. 25, 2006 (JP) ............................. 2006-347502

(51) Int. Cl.
*H01L 21/44* (2006.01)
*H01L 21/48* (2006.01)
*H01L 21/50* (2006.01)
(52) U.S. Cl. .................. 438/108; 29/739; 257/E21.011
(58) Field of Classification Search .................. 29/739; 257/E21.001; 438/108
See application file for complete search history.

(56) References Cited

U.S. PATENT DOCUMENTS 7,262,079 B2 * 8/2007 Xie .............................. 438/108
2005/0046026 A1 * 3/2005 Devanie et al. ............. 257/737

FOREIGN PATENT DOCUMENTS

| JP | 10-125724 | 10/1996 |
| JP | 10-125724 | 5/1998 |
| JP | 11-227589 | 8/1999 |
| JP | 2001-053109 | 2/2001 |

* cited by examiner

*Primary Examiner*—Asok K Sarkar
(74) *Attorney, Agent, or Firm*—Fattibene and Fattibene; Paul A. Fattibene

(57) ABSTRACT

In a flip shop mounting method by no-flow underfill in which resin 54 is pre-coated on a substrate 52, and a semiconductor 50 with bump is mounted on the substrate 52 to join a pad electrode 53 on the substrate 52 to the bump 51, the substrate 52 is placed on an upper surface of a base 11 of a reflow jig 10, the resin 54 highly filled with filler 55 is applied onto the substrate 52, the semiconductor 50 with bump is mounted at a predetermined position over the substrate 52, a press plate 21 is placed on an upper portion of the semiconductor 50, a spacer 13 is interposed between a lower surface of the press plate 21 and an upper surface of the base 11 to regulate an amount of press force of the press plate 21, and horizontal movement of the press plate 21 is regulated by positioning guide pins 15 on the upper surface of the base 11.

3 Claims, 8 Drawing Sheets

FLIP CHIP MOUNTING METHOD BY NO-FLOW UNDERFILL HAVING LEVEL CONTROL FUNCTION

TECHNICAL FIELD

The present invention relates to a flip chip mounting method by no-flow underfill and, more particularly, to a flip chip mounting method by a no-flow underfill in which, when a resin highly filled with a filler is pre-coated on a substrate, a bump is brought into reliable contact with a bump electrode without sandwiching the filler between the bump of a semiconductor and a pad electrode on the substrate to make it possible to reliably perform reflow soldering.

BACKGROUND ART

In recent years, with a reduction in size of electric devices, in order to improve a space-saving property and electric characteristics, semiconductors are frequently mounted on substrates by a flip chip mounting method. In the flip chip mounting method, a projection electrode called a bump is formed on a terminal electrode formed on a rear surface of a semiconductor chip, a semiconductor is fixed to the pad electrode formed on the substrate through the bump to achieve electric conduction.

The bump consists of a solder material or the like. However, since a junction area is small, a mounting strength often lacks. In addition, distortion occurs due to a difference or the like between coefficient of thermal expansions of the substrate and the semiconductor, and the bump may be fall off from the pad electrode because of mechanical shock or thermal shock. Therefore, in order to improve the joint strength, after the bump is joined to the pad electrode on the substrate by thermal welding, an underfill process which pours an epoxy-based resin into a gap between the semiconductor and the substrate and then thermally cures the resin is performed.

However, since the underfill process requires heating processes for connection between electrodes by soldering and curing of the resin and includes a large number of heating steps to increase the cost. Furthermore, workability for pouring a resin from a side of the gap between the semiconductor and the substrate is poor, a space for pouring the resin is necessary. The underfill process is disadvantageous to a reduction in size of an electric device.

In order to solve the drawback, the following mounting method by a no-flow underfill is proposed (for example, see Patent Document 1). That is, a resin is pre-coated on a substrate, and, thereafter, a semiconductor with bump is pressed onto the substrate to spread the pre-coated resin so as to bring the bump and the pad electrode into contact with each other. In this state, the resultant structure is heated to perform connection between the electrodes and curing of the resin by performing a heating step once.

In this case, powder such as alumina powder or silica powder called filler is mixed in the epoxy-based resin used in the underfill process or the no-flow underfill process to increase the strength of the resin. In the underfill process, since a resin is poured after the bump is joined to a pad electrode, the filler does not adverse affect the resin.

However, in the no-flow underfill process, as shown in FIG. 7, since the bump 51 is brought into contact with the pad electrode 53 of the substrate 52 by only the weight of the semiconductor 50, the filler 55 mixed in resin 54 is sandwiched between the bump 51 and the pad electrode 53, and a gap may be formed between the bump 51 and the pad electrode 53. In the no-flow underfill process, since connection between electrodes and curing of the resin are performed in the same heating step, when the gap is formed between the bump 51 and the pad electrode 53, the gap is filled with the resin 54 not to achieve electric conduction.

As shown in FIG. 8, when the semiconductor 50 is forcibly pressed to the substrate 52 by the heavy weight 56 or the like, the filler 55 is pressed out, or electric conduction between the bump 51 and the pad electrode 53 is assured while convoluting the filler 55. However, in this state, when reflow soldering is performed, after the bump 51 is thermally welded on the pad electrode 53, the weight of the heavy weight 56 continuously operates. For this reason, the bump 51 may be broken by pressure, or the bump may run out of the pad electrode 53 to cause electric short circuit.

As a configuration using a heavy weight in the no-flow underfill process, the following apparatus and method are known. That is, a resin containing spherical particles is applied onto an upper surface of a substrate, and the spherical particles are arranged in a region between pad electrodes, a heavy weight is placed on an upper portion of a semiconductor to perform reflow soldering without any change (for example, see Patent Document 2).

Patent Document 1: Japanese Unexamined Patent Publication No. 10-125724
Patent Document 2: Japanese Unexamined Patent Publication No. 2001-53109

DISCLOSURE OF THE PATENT

The invention according to Patent Document 1, a resin is pre-coated on a substrate, connection between electrodes and curing of the resin are performed by performing a heating step once. For this reason, a reduction in cost is achieved by simplifying steps. However, as shown in FIG. 7, the filler mixed in the resin is sandwiched between the bump and the pad electrode, and electric conduction may not be achieved. When the filler mixed in the resin is lessened or the resin is not mixed, a drawback caused by sandwiching the filler can be solved. However, the strength of the resin may be deteriorated to break the bump.

The invention according to Patent Document 2, filler is pressed out by a heavyweight, or the filler is convoluted to assure electric conduction between a bump and a pad electrode. At the same time, spherical particles are mixed in a resin to hold an interval between a semiconductor and a substrate at a predetermined size. However, the spherical particles are not always accurately arranged in a region between pad electrode, and the heavy weight may be displaced.

Therefore, it is an object of the present invention to make it possible to bring a pad electrode of a substrate into reliable contact with a bump to reliably perform reflow soldering when a resin highly filled with a filler is pre-coated on a substrate to mount a semiconductor.

The present invention has been proposed to achieve the above object. An invention according to a first aspect provides a flip chip mounting method obtained by a no-flow underfill having a level control function in which a resin is pre-coated on a substrate, and, thereafter, a semiconductor with bump is mounted on the substrate to join a pad electrode of the substrate to the bump, wherein the substrate is placed on an upper surface of a base of a reflow jig, a resin highly filled with the filler is applied to the substrate, the semiconductor with bump is mounted at a predetermined position of the substrate, a heavy weight larger than an overall size of a product of the substrate is placed on upper portion of the semiconductor, and a spacer is interposed between a lower surface of the heavy weight and the upper surface of the base to regulate an amount of press force of the heavy weight, and horizontal movement of the heavy weight is regulated by a positioning guide upright standing on the upper surface of the base.

According to this configuration, when the semiconductor is mounted such that the resin highly filled with the filler is pre-coated on the substrate, the heavy weight placed on the upper portion of the substrate forcibly presses the semiconductor onto the substrate, and horizontal movement of the heavy weight is regulated by the positioning guide. For this reason, the bump is accurately pressed onto the pad electrode without displacement of the bump.

In this state, when reflow soldering is performed, even though the filler mixed in a resin is sandwiched between the bump and the pad electrode, the heavy weight forcibly presses the semiconductor to the substrate. For this reason, the filler is pressed out from a portion between the bump and the pad electrode, and the bump is reliably joined to the pad electrode by thermal welding. Alternatively, the sandwiched filler is pressed from above while being convoluted between the bump and the pad electrode, and the bump is reliably joined to the pad electrode by thermal welding. Since a spacer is interposed between the lower surface of the heavy weight and the upper surface of the base, an amount of press force of the heavy weight is regulated even though the bump is thermally welded. The bump is not broken by pressure, or the bump does not run out of the pad electrode not to cause electric short circuit.

The present invention, as described above, even though the filler mixed in the resin is sandwiched between the bump and the pad electrode, the filler can be prevented from being pressed out by pressing the semiconductor by the heavy weight, or a gap can be prevented from being formed between the bump and the pad electrode while convoluting the filler. For this reason, reflow soldering is performed to assure electric conduction between the bump and the pad electrode. Horizontal movement of the heavy weight is regulated by a positioning guide, displacement does not occur. Furthermore, an amount of press force is regulated by the spacer, the bump can be prevented from being broken by pressure.

The present invention can contribute to improvement of workability and reliability in a flip chip mounting method by a now-flow underfill.

BEST MODE FOR CARRYING OUT THE INVENTION

A flip chip mounting method obtained by a no-flow underfill according to the present invention will be described below with reference to preferred embodiments. When a resin highly filled with the filler is pre-coated on a substrate to mount a semiconductor, a bump is brought into contact with a pad electrode of the substrate at a correct position to make it possible to reliably perform reflow soldering. In order to achieve the above object, according to the present invention, the substrate is placed on an upper surface of a base of the reflow jig, a resin highly filled with the filler is applied onto the substrate, the semiconductor with bump is mounted at a predetermined position of the substrate, and a heavy weight larger than an overall size of the product is placed on an upper portion of the semiconductor. At the same time, a spacer is interposed between the lower surface of the heavy weight and the upper surface of the base to regulate an amount of press force of the heavy weight, and horizontal movement of the heavy weight is regulated by a positioning guide upright standing on the upper surface of the base.

Figure 1:
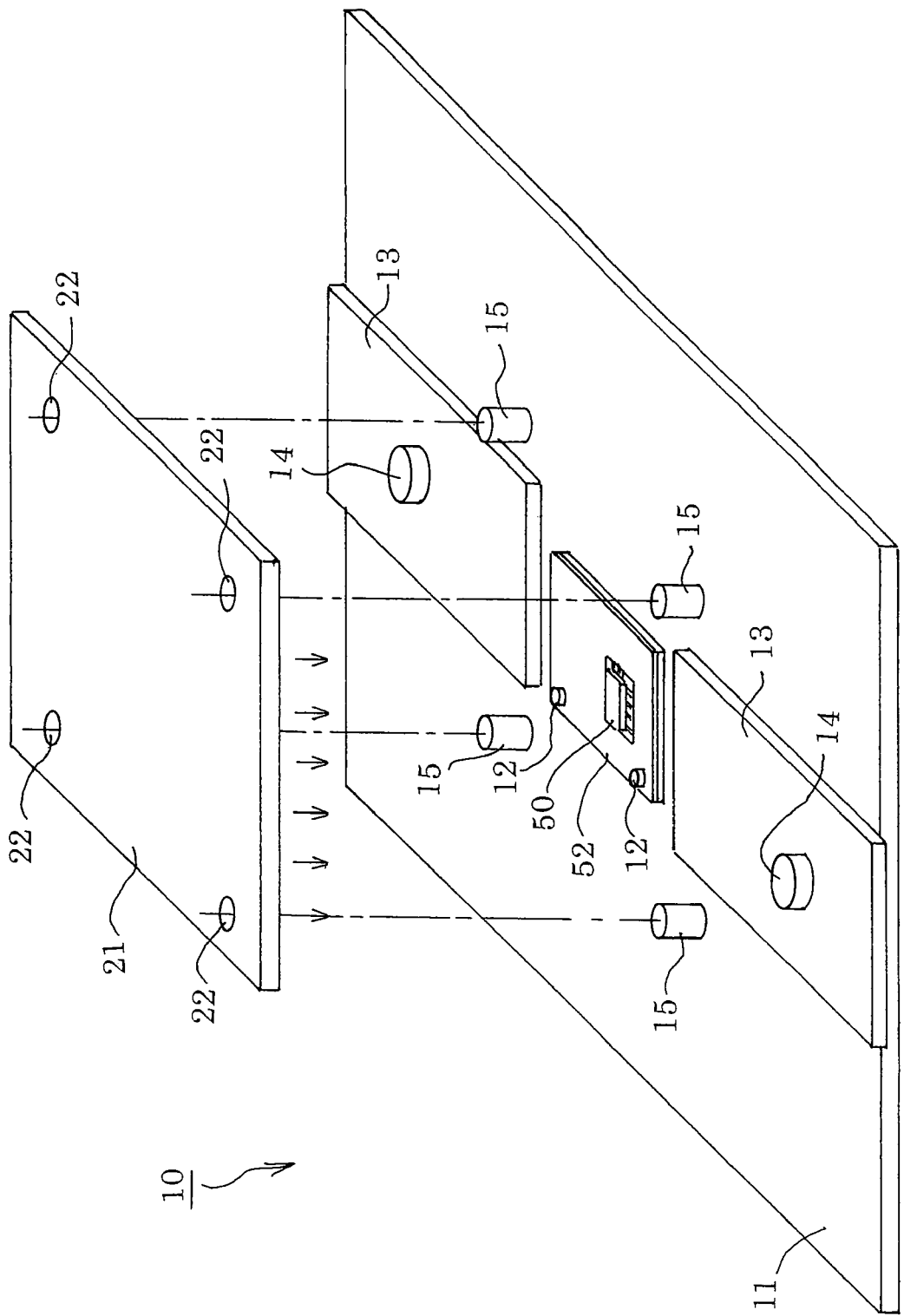
FIG. 1 is an exploded perspective view of a reflow jig used in a mounting method according to the present invention.

FIG. 1 is an exploded perspective view of a reflow jig 10 used in the mounting method according to the present invention. The reflow jig 10 is constituted by a base 11 on which a substrate 52 is placed and a press plate 21 arranged above the base 11 to mount a semiconductor 50 on the substrate 52.

On the upper surface of the base 11, a fixing pin 12 to fix the substrate 52 at a correct position upright stands, spacers 13 are fixed on both the sides of the substrate 52 by fixing pins 14, and guide pins 15 are upright standing in four directions of the substrate 52.

Guide holes 22 are formed at a position corresponding to the guide pins 15 in the press plate 21, and the guide pins 15 are loosely fitted in the guide holes 22, respectively, and the press plate 21 is positioned such that the press plate 21 is vertically movable with respect to the base 11. The guide holes 22 serves as a positioning guide for regulating horizontal movement of the press plate 21. The press plate 21 operates as a heavy weight, and, as will be described later, forcibly presses the semiconductor 50 to the substrate 52.

Figure 2:
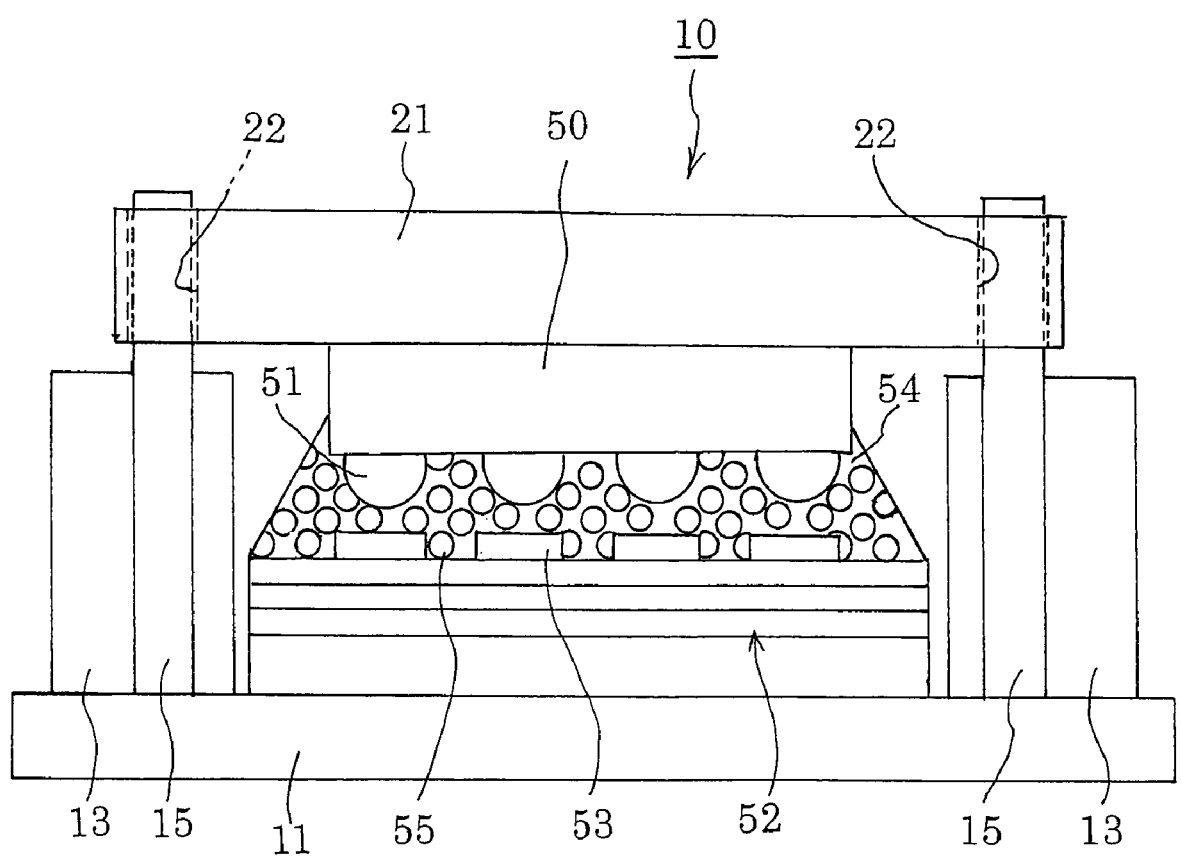
FIG. 2 is an explanatory pattern diagram showing an assembling state of the reflow jig in FIG. 1.

The flip chip mounting method by the no-flow underfill according to the present invention will be described below. FIG. 2 is an explanatory pattern diagram showing an enlarged and magnified main part of the reflow jig 10 in an assembling state. A substrate 52 is fixed at a predetermined position on the base 11, and an epoxy-based resin 54 highly filled with the filler 55 is applied in advance to a surface of the substrate 52 on which a pad electrode 53 is formed.

The semiconductor 50 is arranged on the upper portion of the substrate 52 applied with the resin 54, a bump 51 formed on a rear surface of the semiconductor 50 and the pad electrode 53 on the substrate 52 are vertically opposite to each other through the resin 54 without displacement. The press plate 21 larger than the overall size of the product of the substrate 52 is placed on the upper portion of the semiconductor 50.

Figure 3:
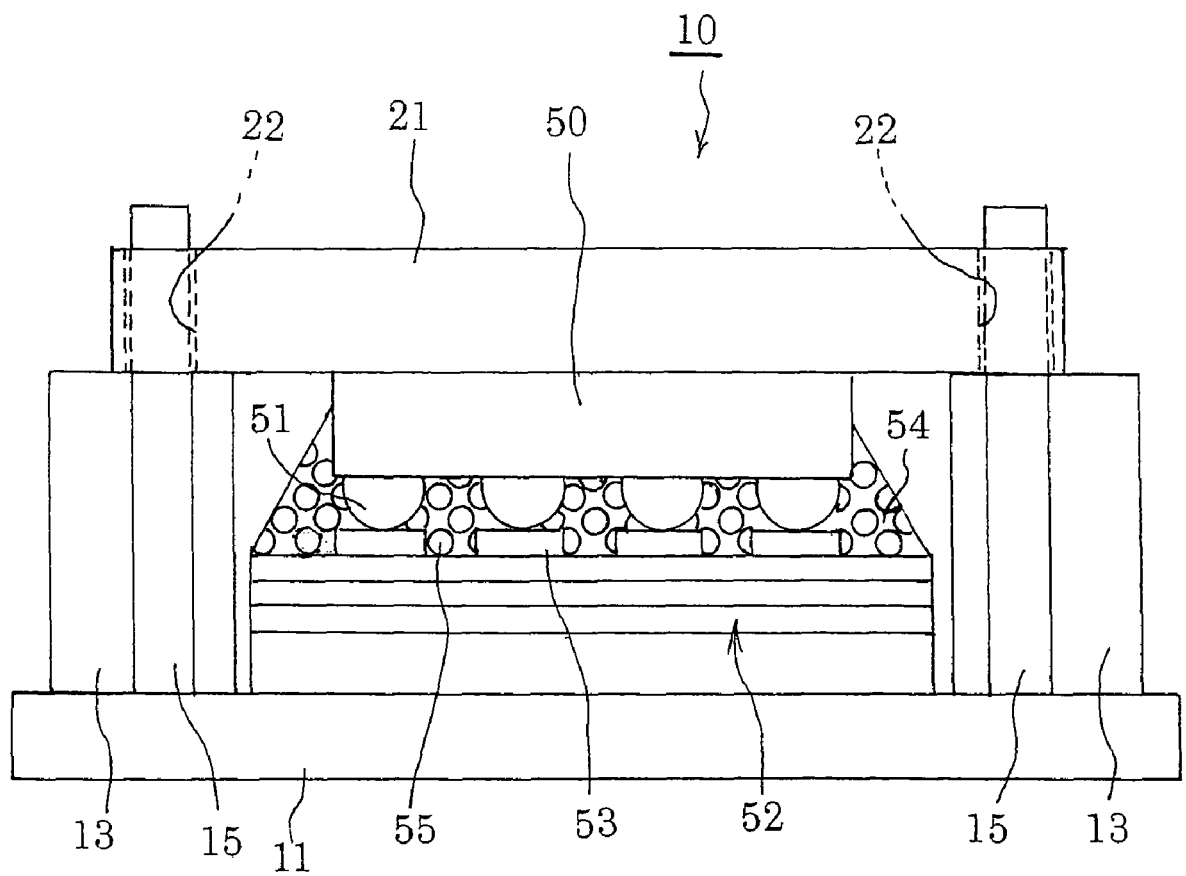
FIG. 3 is an explanatory diagram showing operation processes of the reflow jig in FIG. 2.
Figure 4:
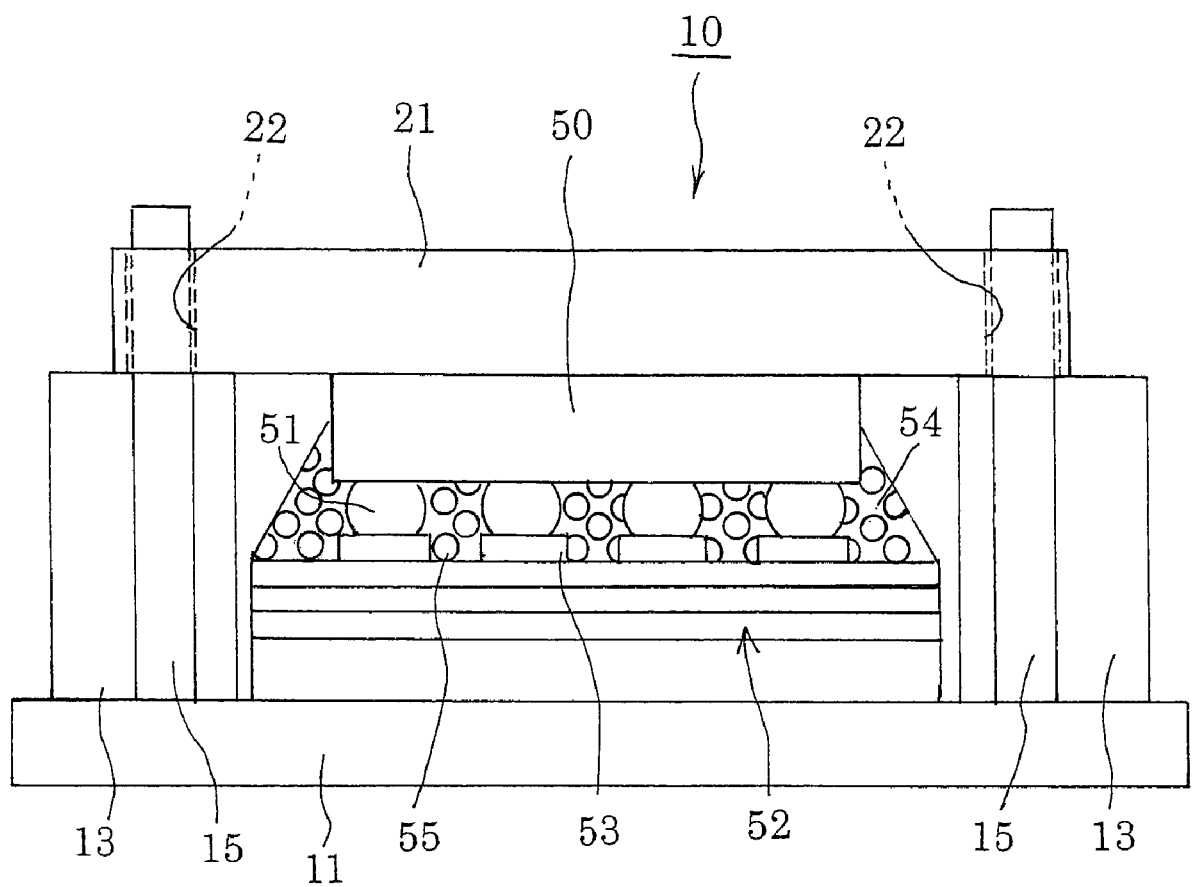
FIG. 4 is an explanatory diagram showing a final process of the reflow jig in FIG. 2.

The press plate 21 operates as a heavy weight which forcibly presses the semiconductor 50 to the substrate 52 to cause the bump 51 of the semiconductor 50 to spread out the pre-coated resin 54, and, as shown in FIG. 3, the bump 51 and the pad electrode 53 are brought into contact with each other. In this state, when the resultant structure is heated by a reflow soldering process, as shown in FIG. 4, the bump 51 is joined to the pad electrode 53 of the substrate 52 by thermal welding, and the resin 54 is cured to protect the circumferences of the bump 51 and the pad electrode 53.

The spacer 13 is formed between the lower surface of the press plate 21 and the upper surface of the base 11. When the press plate 21 is brought into contact with the spacer 13, dropping of the press plate 21 is stopped. For this reason, the weight of a heavy weight 56 does not continuously operate after the bump 51 is thermally welded on the pad electrode 53. In this manner, since the amount of press force of the press plate 21 is regulated by the spacer 13, the bump 51 can be prevented from being broken by pressure, or an electric short circuit can be prevented from being caused by running the bump 51 out of the pad electrode 53.

Figure 5:
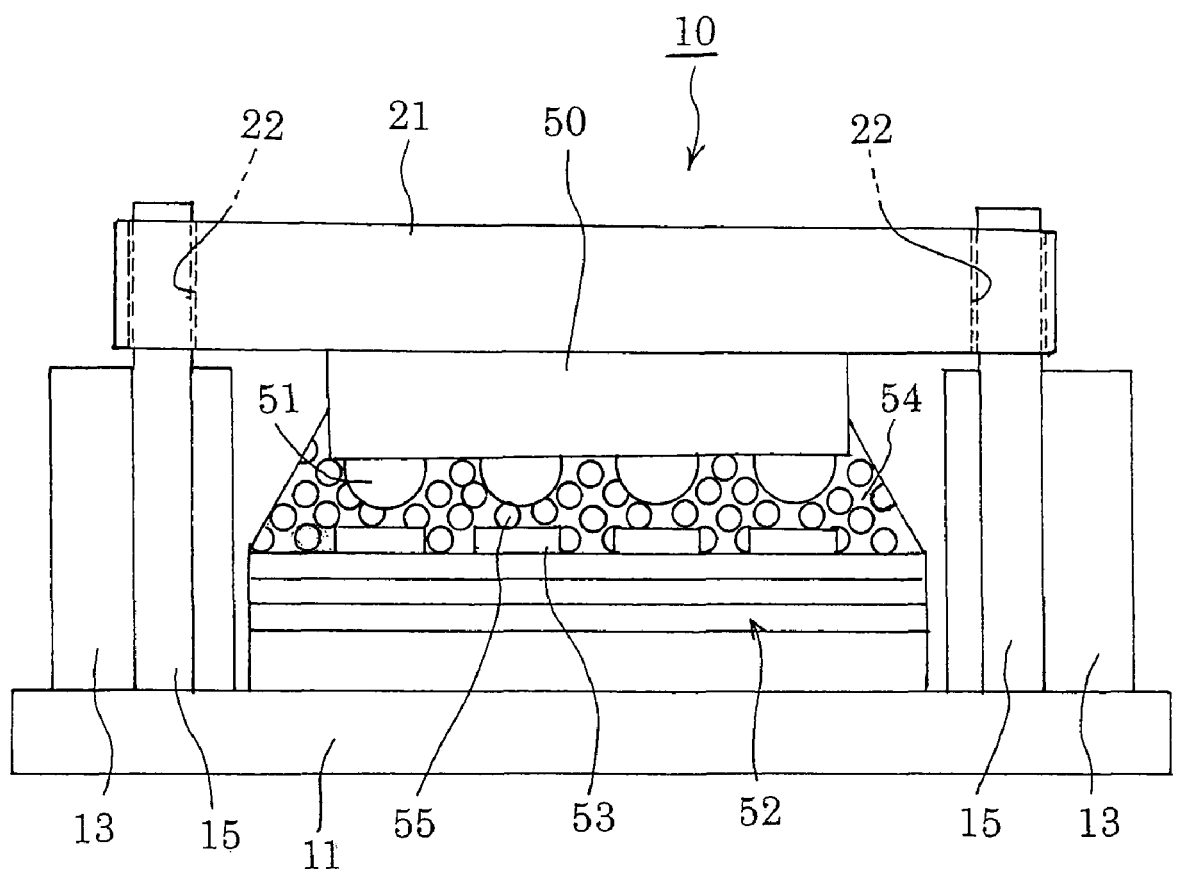
FIG. 5 is an explanatory diagram showing other operation processes of the reflow jig in FIG. 2.

As shown in FIG. 5, even though the filler 55 mixed in the resin 54 is sandwiched between the bump 51 and the pad electrode 53, the press plate 21 forcibly presses the semiconductor 50 to the substrate 52, the filler 55 is pressed out of a portion between the bump 51 and the pad electrode 53. As shown in FIG. 3, the bump 51 is reliably joined to the pad electrode 53 by thermal welding.

Figure 6:
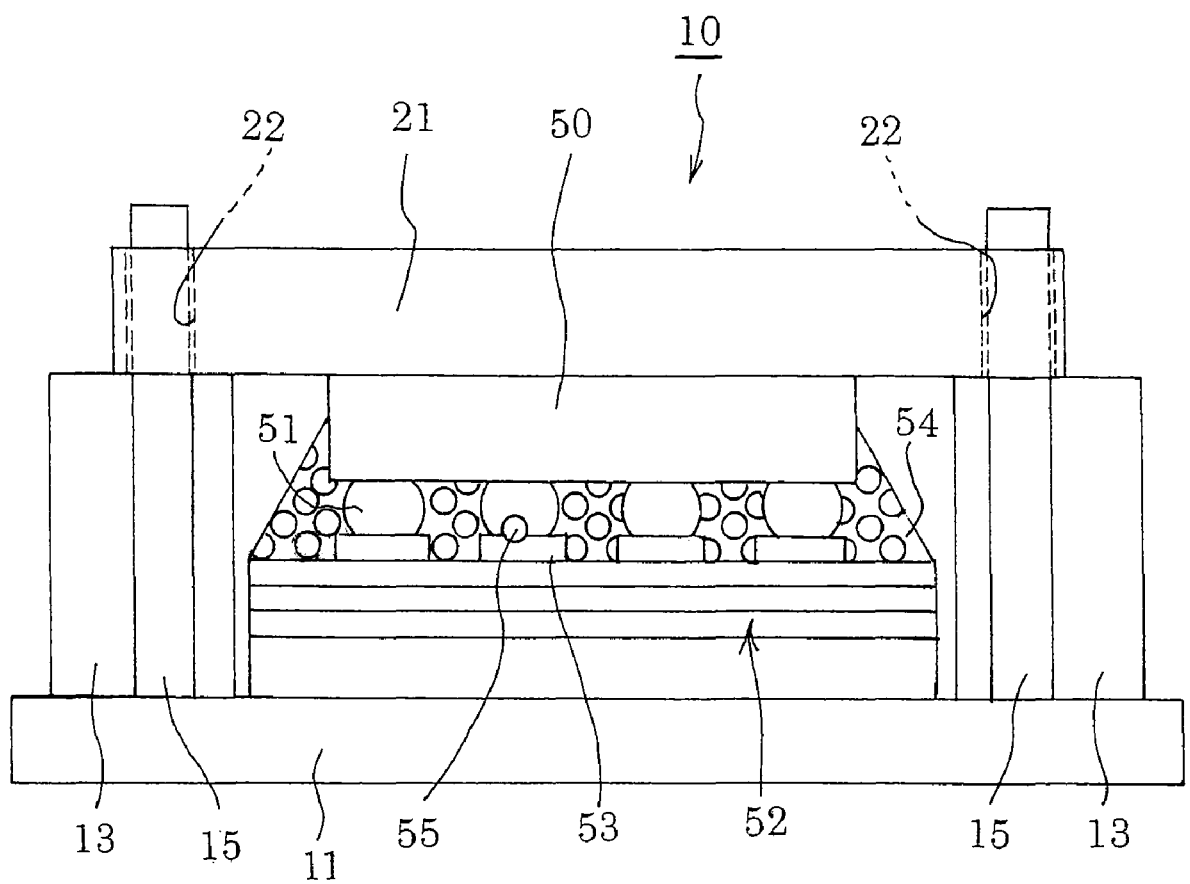
FIG. 6 is an explanatory diagram showing a final process of a reflow jig in FIG. 5.
Figure 7:
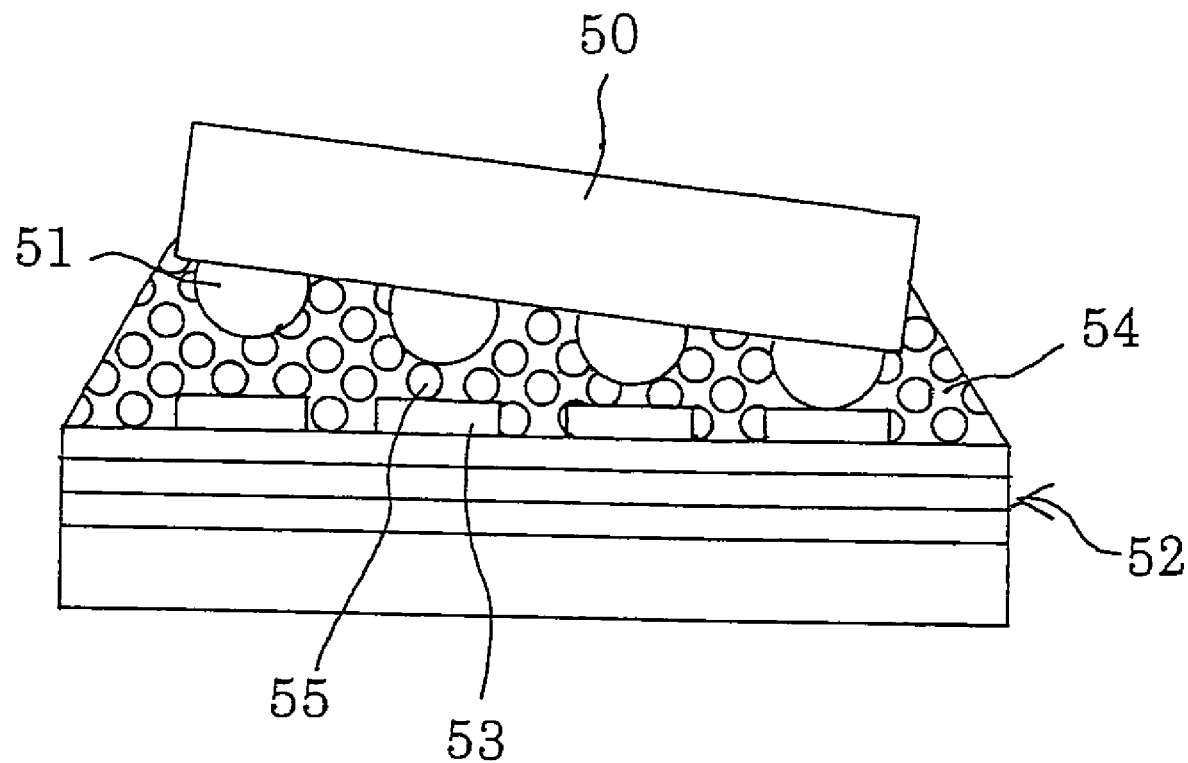
FIG. 7 is an explanatory pattern diagram showing a defect of a conventional no-flow underfill process.
Figure 8:
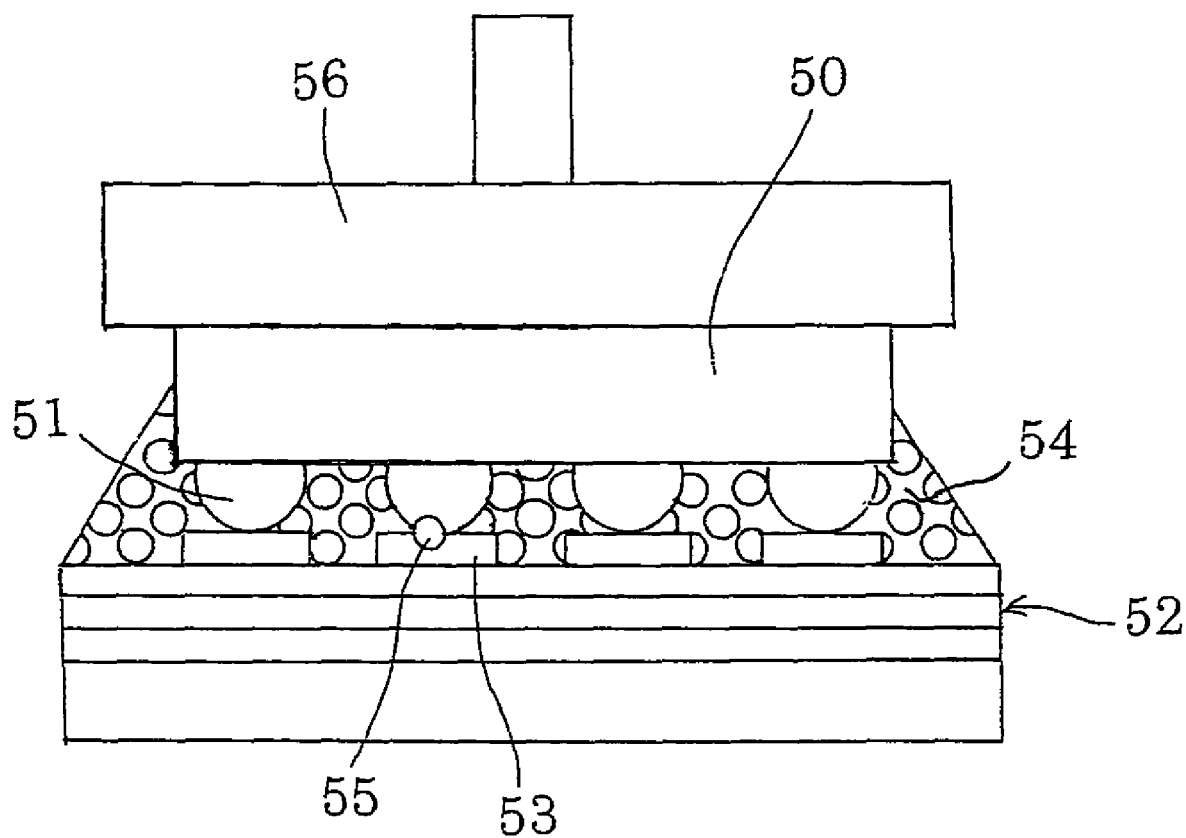
FIG. 8 is an explanatory pattern diagram showing an example which solves the defect in FIG. 7 by a heavy weight.

As shown in FIG. 6, the sandwiched filler 55 is pressed from upward while being convoluted between the bump 51 and the pad electrode 53, and the bump 51 is reliably joined to the pad electrode 53 by thermal welding. In this case, since the amount of press force of the press plate 21 is regulated by the spacers 13, the bump 51 is not broken by pressure, or electrical short circuit is not caused by running the bump out of the pad electrode 53.

In this manner, the semiconductor 50 can be reliably mounted by using the resin 54 highly filled with the filler 55, the method can contribute to improvement of workability and reliability in the flip chip mounting method by the no-flow underfill.

Various modifications of the present invention can be effected without departing from the spirit and scope of the present invention. It is natural that the present invention covers the modifications.

What is claimed is:

1. A flip chip mounting method by a no-flow underfill in which a resin is pre-coated on a substrate, and, thereafter, a semiconductor with bump is mounted on the substrate to join a pad electrode on the substrate to the bump, wherein
a flip chip mounting method by a no-flow underfill comprises a level control function wherein the substrate is placed on an upper surface of a base of a reflow jig, a resin highly filled with the filler is applied to the substrate, the semiconductor with bump is mounted on a predetermined position of the substrate, a heavy weight larger than an overall size of a product of the substrate is placed on an upper portion of the semiconductor, a spacer is interposed between a lower surface of the heavy weight and an upper surface of the base to regulate an amount of press force of the heavy weight, and horizontal movement of the heavy weight is regulated by a positioning guide upright standing on the upper surface of the base.

2. A flip chip mounting method for mounting a semiconductor with a bump onto a substrate having a pad electrode comprising the steps of:
placing a substrate having pad electrodes on a base;
pre-coating a resin on the substrate;
placing a semiconductor with bumps in a predetermined position over the substrate having the pad electrodes positioned under the bumps on the semiconductor;
applying a press plate having guide holes to an upper portion of the semiconductor, whereby the press plate is vertically movable and a press force is applied to the semiconductor;
positioning a spacer between the base and the press plate regulating the vertical movement of the press plate, whereby contact with the bump and the pad electrode is regulated; and
regulating horizontal movement of the press plate with guide pins mounted on the base corresponding to the guide holes,
whereby the bump is brought into reliable contact with the pad electrode.

3. A flip chip mounting reflow jig for mounting a semiconductor with a bump onto a substrate having a pad electrode comprising:
a base;
at least two spacers placed on said base;
a substrate placed on said base between said at least two spacers adapted to receive a semiconductor having bumps;
a plurality of pad electrodes formed on said substrate;
a plurality of guide pins placed onto said base; and
a press plate having a plurality of guide holes adapted to receive said plurality of guide pins, said press plate positioned over said substrate and said at least two spacers wherein said plurality of guide pins and the plurality of guide holes mate preventing horizontal movement, and said at least two spacers permit limited vertical movement of said press plate,
whereby said at least two spacers limit the vertical movement of said press plate and said plurality of guide pins and the plurality of guide holes prevent horizontal movement of said press plate resulting in a reliable contact between the bumps and said plurality of pad electrodes after mounting.

* * * * *